(12) United States Patent
Fumitake

(10) Patent No.: US 8,679,950 B2
(45) Date of Patent: Mar. 25, 2014

(54) MANUFACTURING METHOD FOR SEMICONDUCTOR DEVICE HAVING SIDE BY SIDE DIFFERENT FINS

(75) Inventor: Mieno Fumitake, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/481,800

(22) Filed: May 26, 2012

(65) Prior Publication Data

US 2013/0119477 A1 May 16, 2013

(30) Foreign Application Priority Data

Nov. 10, 2011 (CN) .......................... 2011 1 0354571

(51) Int. Cl.
*H01L 21/20* (2006.01)
*H01L 21/36* (2006.01)
*H01L 21/338* (2006.01)

(52) U.S. Cl.
USPC .................... 438/478; 438/193; 257/E21.632; 257/E27.062

(58) Field of Classification Search
USPC .................. 257/308, 369, E21.632, E27.062; 438/193, 478
See application file for complete search history.

(56) References Cited

U.S. PATENT DOCUMENTS

| | | | |
|---|---|---|---|
| 2004/0099903 A1* | 5/2004 | Yeo et al. ...................... | 257/317 |
| 2005/0130358 A1* | 6/2005 | Chidambarrao et al. ..... | 438/197 |
| 2006/0113605 A1* | 6/2006 | Currie .......................... | 257/368 |
| 2007/0004117 A1* | 1/2007 | Yagishita ...................... | 438/197 |
| 2008/0135886 A1* | 6/2008 | Irisawa et al. ................. | 257/255 |
| 2008/0135935 A1* | 6/2008 | Cho et al. ...................... | 257/347 |
| 2008/0224258 A1* | 9/2008 | Schepis et al. ................ | 257/522 |
| 2009/0101995 A1* | 4/2009 | Beintner et al. ............... | 257/412 |
| 2009/0124097 A1* | 5/2009 | Cheng ........................... | 438/792 |
| 2009/0159972 A1* | 6/2009 | Jakschik et al. ............... | 257/350 |
| 2010/0187503 A1* | 7/2010 | Moriyama et al. ............. | 257/24 |
| 2011/0147811 A1* | 6/2011 | Kavalieros et al. ........... | 257/288 |
| 2011/0175163 A1* | 7/2011 | Cartier et al. ................. | 257/347 |
| 2011/0227165 A1* | 9/2011 | Basker et al. ................. | 257/369 |
| 2011/0260257 A1* | 10/2011 | Jagannathan et al. ........ | 257/369 |
| 2012/0074464 A1* | 3/2012 | Cea et al. ...................... | 257/190 |
| 2012/0091528 A1* | 4/2012 | Chang et al. .................. | 257/347 |
| 2012/0235247 A1* | 9/2012 | Cai et al. ....................... | 257/392 |
| 2012/0319211 A1* | 12/2012 | van Dal et al. ................ | 257/401 |
| 2013/0001591 A1* | 1/2013 | Wu et al. ....................... | 257/77 |
| 2013/0045576 A1* | 2/2013 | Tsai et al. ...................... | 438/151 |
| 2013/0062594 A1* | 3/2013 | Chu-Kung et al. ............ | 257/29 |
| 2013/0092984 A1* | 4/2013 | Liu et al. ....................... | 257/288 |

\* cited by examiner

*Primary Examiner* — David S Blum
(74) *Attorney, Agent, or Firm* — Innovation Counsel LLP

(57) ABSTRACT

A semiconductor device includes a first fin formed of a first semiconductor material and a second fin comprising a layer formed of a second semiconductor material. The first semiconductor material is silicon, and the second semiconductor material is silicon-germanium (SiGe). The second fin further includes a layer of the first semiconductor material below the layer of the second semiconductor material. The semiconductor device also includes a hard mask layer on the first and second fins and an insulator layer that is disposed below the first and second fins. The first and second fins are used to form an N-channel and a P-channel semiconductor device, respectively.

12 Claims, 5 Drawing Sheets

100

MANUFACTURING METHOD FOR SEMICONDUCTOR DEVICE HAVING SIDE BY SIDE DIFFERENT FINS

CROSS-REFERENCE TO RELATED APPLICATIONS

This application claims priority to Chinese Patent Application No. 201110354571.1, filed on Nov. 10, 2011 and entitled "Semiconductor Device and manufacturing Method Thereof", which is incorporated herein by reference in its entirety.

This application is related to commonly owned patent application Ser. No. 13/481,803, entitled "Semiconductor Device and Manufacturing Method Thereof", filed concurrently herewith, the entire content of which is herein incorporated by reference.

FIELD OF THE INVENTION

The present disclosure relates to the field of semiconductor manufacturing techniques, and more specifically, relates to fin semiconductor devices and manufacturing method thereof.

DESCRIPTION OF THE RELATED ART

With the continuous development of semiconductor techniques, critical dimensions of devices continue to shrink. Under this tendency, fin semiconductor devices have been proposed, such as fin transistors (FinFETs). Presently, Fin-FETs have been widely used in the fields of memory and logical devices.

In "Challenges and Solutions of FinFET Integration in an SRAM Cell and a Logic Circuit for 22 nm node and beyond", H. Kawasaki, et al, IEDM 2009, pages 289~292, a FinFET technology suitable for even smaller nodes has been introduced. In that publication, the fin of a semiconductor device is fabricated through sidewall image transfer (SIT) techniques.

However, such FinFET techniques encounter a problem of discreteness (variation) of channel widths of devices.

On the other hand, if the fin has a large height, a larger space can be preserved for the gate. However, with the continuous decrease of fin dimension (particularly, thickness or width), it become an important issue that fins may collapse and may be unexpectedly removed in semiconductor device fabrication processes.

Therefore, there is a need to mitigate or eliminate the above described problems of the prior art. In view of this, a novel semiconductor device and manufacturing method thereof have been proposed.

SUMMARY OF THE INVENTION

The inventor has noticed that the increasingly aggressive requirements for fin dimensions can be moderated if carrier mobility in a device can be improved.

Embodiments of the present disclosure can improve carrier mobility in a fin semiconductor device, so as to lower the device size requirements.

An embodiment of the present disclosure provides a semiconductor device that includes a first fin formed of a first semiconductor material, and a second fin comprising a layer formed of a second semiconductor material, wherein the first semiconductor material is silicon, and the second semiconductor material is silicon-germanium (SiGe).

In one embodiment, the second fin further comprises a layer of the first semiconductor material that is disposed below the layer of the second semiconductor material.

In one embodiment, the semiconductor device further comprises a hard mask layer located on the first and second fins, respectively.

In one embodiment, the semiconductor device further comprises an insulator layer that is disposed below the first and second fins.

In one embodiment, the first fin is used to form an N channel semiconductor device, and the second fin is used to form a P channel semiconductor device.

In one embodiment, the semiconductor device further comprises gate insulating layers and gates for the N channel semiconductor device and the P channel semiconductor device.

In one embodiment, the gate for the N channel semiconductor device and the gate for the P channel semiconductor device are formed of metals having respective appropriate work functions.

According to another embodiment of the present disclosure, a method of manufacturing a semiconductor device includes: (a) providing a first substrate having a first semiconductor layer and a hard mask layer on the first semiconductor layer, wherein the first semiconductor layer comprises a first region and a second region, the first region comprising a layer formed of a first semiconductor material, the second region comprising a layer formed of a second semiconductor material, wherein the first semiconductor material is Silicon (Si) and the second semiconductor material is Silicon-Germanium (SiGe); (b) forming a mask layer having a first pattern and a second pattern on the hard mask layer, so that the first pattern is located on a portion of the hard mask layer which is over the first region and the second pattern is located on a portion of the hard mask layer which is over the second region; and (c) etching the hard mask layer and the first semiconductor layer using the mask layer as an etch mask to form a first fin in the first region and a second fin in the second region, such that the first fin is formed of the first semiconductor material, and the second fin comprises a layer formed of the second semiconductor material.

In one embodiment, the first fin is adaptable for forming an N channel semiconductor device, and the second fin is adaptable for forming a P channel semiconductor device.

In one embodiment, the step (b) of forming the mask layer comprises: (b1) forming a mandrel layer on the hard mask layer, the mandrel layer has an opening formed therein, a first sidewall of the opening is located at the first region and a second sidewall is located at the second region, (b2) forming a first spacer on the first sidewall to form a first pattern and a second spacer on the second sidewall to form a second pattern, and (b3) removing the mandrel layer.

In one embodiment, the method further comprises (d) removing the mask layer.

In one embodiment, the method further comprises (e) removing the hard mask layer.

In one embodiment, the providing a first substrate comprises: (a1) providing a second substrate, the second substrate comprising an initial semiconductor layer formed of silicon (Si); and (a2) selectively forming a SiGe layer in the initial semiconductor layer.

In one embodiment, the first substrate further comprises an insulator layer below the first semiconductor layer.

In one embodiment, the selectively forming a SiGe layer in the initial semiconductor layer comprises: (a21) forming a sacrificial blocking layer on the initial semiconductor layer; (a22) forming an opening through the sacrificial blocking layer and extending into the initial semiconductor layer; (a23) selectively growing silicon-germanium (SiGe) in the opening; and (a24) removing the sacrificial blocking layer.

In one embodiment, the method further comprises: (a3) after step selectively forming a SiGe layer in the initial semiconductor layer, performing annealing or oxidation on the formed SiGe layer.

In one embodiment, the method further comprises: (f) forming gate insulating layers and gates for an N channel semiconductor device and a P channel semiconductor device.

In one embodiment, the gate for the N channel semiconductor device and the gate for the P channel semiconductor device are formed of metals having respective appropriate work functions.

Although the present disclosure is particularly useful in advanced semiconductor device fabrication techniques (for example, memory devices, logic devices, etc.), the present disclosure is not limited thereto. In practice, the present disclosure may have a wide range of applications.

Further benefits, advantages, and features of the present disclosure will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure. The present disclosure can be more clearly understood by reading the following detailed description with reference to the accompanying drawings, in which.

Figure 1:
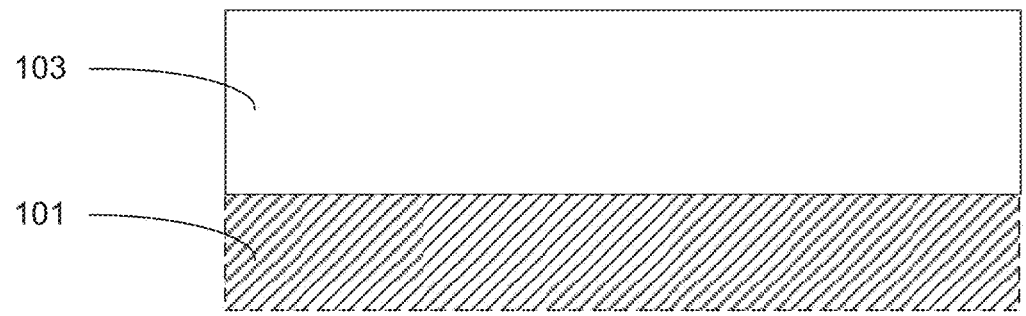
FIG. 1 is schematic cross-sectional diagram of a substrate in a method of manufacturing a semiconductor device according to an embodiment of the present disclosure.

It should be understood that these drawings are merely illustrative in nature and are not intended to limit the scope of the present disclosure. In the drawings, various components are not drawn to scale or according to their actual shapes, wherein, some of the components (such as, layers or parts) may be enlarged relative to others so as to more clearly explain the principles of the present disclosure. Moreover, details that may obscure the gist of the present disclosure are not shown in the drawings.

DESCRIPTION OF THE EMBODIMENTS

Embodiments of the present disclosure will be described hereinafter in conjunction with accompanying drawings below.

FIG. 1 illustrates a schematic diagram of a step of providing a substrate in a method of manufacturing a semiconductor device according to an embodiment of the present disclosure.

As shown in FIG. 1, an initial substrate 100 is provided. The initial substrate 100 comprises an initial semiconductor layer 103. The initial semiconductor layer 103 can be formed of a first semiconductor material, for example, silicon (Si).

In a preferred embodiment, the substrate 100 is a Semiconductor on Insulator (SOI) substrate. In such a case, the substrate 100 may further comprise an insulator layer 101 below the initial semiconductor layer 103, and the substrate 100 may further comprise a semiconductor layer (not shown) below the insulator layer 101. However, the present disclosure is not limited thereto.

It should be appreciate that although a SOI substrate is preferable, the present disclosure can also be applicable to mono-crystalline silicon substrates, that is, bulk substrates. As those skilled in the art will appreciate, in such a case, there can be no insulator layer below the semiconductor layer. Hence, the insulator layer is shown by dotted lines in the figures.

Figure 2:
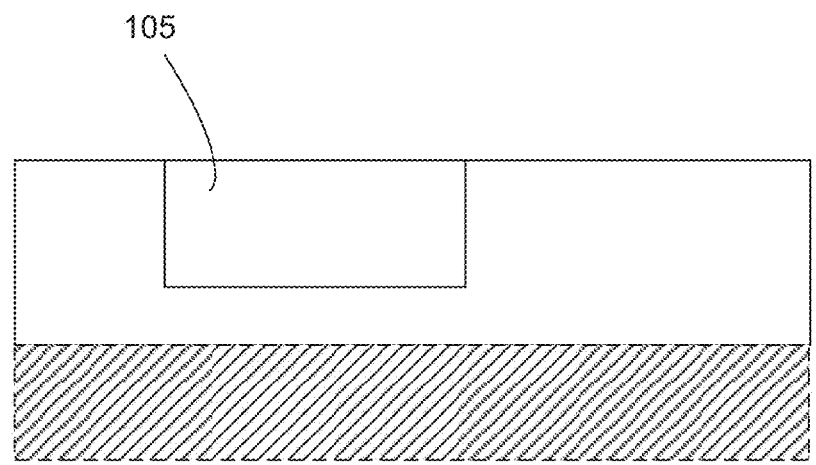
FIG. 2 is schematic cross-sectional diagram of forming a second semiconductor material layer on the substrate of FIG. 1.

FIG. 2 is a schematic cross-sectional diagram illustrating a second semiconductor material layer in the substrate according to an embodiment of the present disclosure.

As shown in FIG. 2, a second semiconductor material layer 105 is selectively formed in the initial semiconductor layer 103. In one embodiment, the second semiconductor material has a mobility of P-type carriers (P-type carrier mobility) that is greater than the P-type carrier mobility of the first semiconductor material. In one embodiment, the second semiconductor material can be silicon-germanium (SiGe).

In one specific embodiment, a sacrificial blocking layer can be formed on the semiconductor layer 103. The sacrificial blocking layer can be an oxide layer (for example, a layer of silicon oxide, but not limited thereto), formed by, for example, thermal oxidation or deposition. Then, an opening can be formed through the sacrificial blocking layer and extending into the initial semiconductor layer 103. Then, a second semiconductor material is formed in the opening. Herein, in the case of SiGe as the second semiconductor material, as appreciated by those skilled in the art, SiGe can be selectively grown in the opening, because growth of SiGe can take place on the exposed surface of Si and substantially not on the sacrificial blocking layer. Thereafter, the sacrificial blocking layer can be removed, and optionally, the surface of the substrate can be planarized.

In the case of using a Silicon-on-Insulator substrate as the substrate, in one embodiment, the opening can be formed in the initial semiconductor layer 103 such that five atom layers or less of Si is remained below the bottom surface of the opening.

It should be understood that the method of selectively forming the SiGe layer 105 is not limited thereto. For example, an opening can be formed in the Si layer, followed by SiGe growth and CMP to form the structure as shown in FIG. 2.

Furthermore, after forming the SiGe layer, annealing or oxidation can be optionally performed on the SiGe layer to improve or stabilize the atom disorder of the SiGe layer. In the case of oxidation, oxides formed through the oxidation can be removed.

Figure 3:
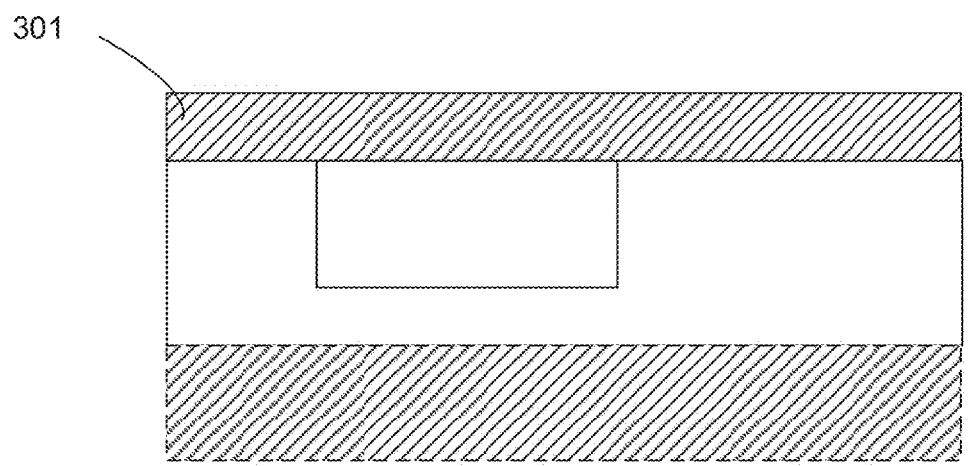
FIG. 3 is schematic cross-sectional diagram of forming a hard mask layer after the steps of FIG. 2.

Then, as shown in FIG. 3, a hard mask layer 301 is formed on the substrate, that is, on the SiGe layer and the Si layer. The hard mask is, in one embodiment, formed of, but not limited to, amorphous silicon (α-silicon). Other suitable hard mask materials can be selected depending on different requirements and application situations by those skilled in the art.

It should be appreciated that SiGe employed in the specific embodiment of the present disclosure is merely an exemplary material for improving carrier mobility in a P-channel device, and the present disclosure shall not be limited thereto. Other suitable semiconductor materials can be used to substitute SiGe, in the present disclosure. In addition, the present disclosure is also applicable in the cases where semiconductor materials other than Si are used as substrate materials (for example, corresponding to mono-crystalline semiconductor) or epitaxial materials (for example, corresponding to SOI substrate).

Other suitable semiconductor materials can be used to substitute SiGe in the present disclosure. In such a case, the second semiconductor material layer can be formed by a manner known in the art, and therefore, the step or method of forming the second semiconductor material layer is not limited to the step or method described above.

Hence, a method of manufacturing a semiconductor device according to an embodiment of the present disclosure may include providing a first substrate (so termed to distinguish from the initial substrate 100, which is referred to as a second substrate herein), the first substrate has a first semiconductor layer and a hard mask later on the first semiconductor layer, wherein the first semiconductor layer comprises a first region (for example, an region formed of Si horizontally or laterally adjacent to the SiGe layer) and a second region (for example, SiGe layer 105). The first region includes a layer formed from a first semiconductor material (for example, Si), and the second region comprising a layer formed from a second semiconductor material (for example, SiGe) which is different from the first semiconductor material.

In one embodiment, the second semiconductor material (for example, SiGe) has a mobility of P-type carriers (i.e., P-type carrier mobility) that is greater than the P-type carrier mobility of the first semiconductor material (for example, Si).

Figure 4:
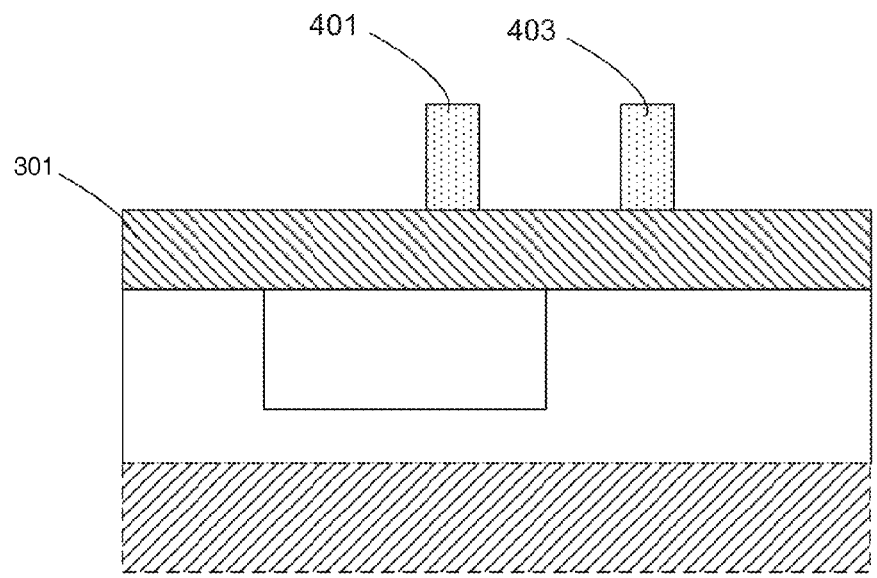
FIG. 4 is schematic cross-sectional diagram of forming a patterned mask after the steps of FIG. 3.

Then, as shown in FIG. 4, a mask layer is formed on the hard mask 301, the mask layer having a first pattern or feature 403 and a second pattern or feature 401, and the first pattern being located on the first region, and the second pattern being located on the second region. Generally, the surface area of the first pattern (upper surface area or lower surface area) is less than the surface area of the first region, so that the surface area (upper surface area or lower surface area) of the fin to be formed is smaller than the surface area of the first region.

It should be understood that, for some applications under large technology nodes, the mask can be formed by using a photo-resist. With the continuously shrinking of technology nodes, it is becoming difficult to obtain small critical dimensions beyond photolithography limits through photolithography. In such a case, patterns 401 and 403 can be formed through sidewall image transfer (SIT) techniques, double patterning, SAM (self-assembly) techniques, nano-imprint techniques, or the like.

Figure 5A:
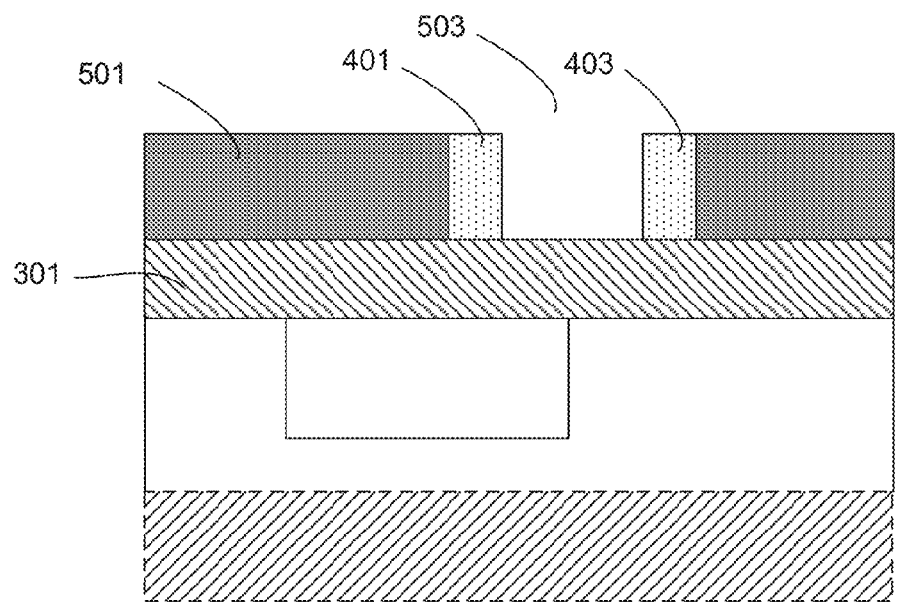
FIGS. 5A~5C are schematic diagrams illustrating steps of forming a mask layer according to embodiments of the present disclosure.
Figure 5B:
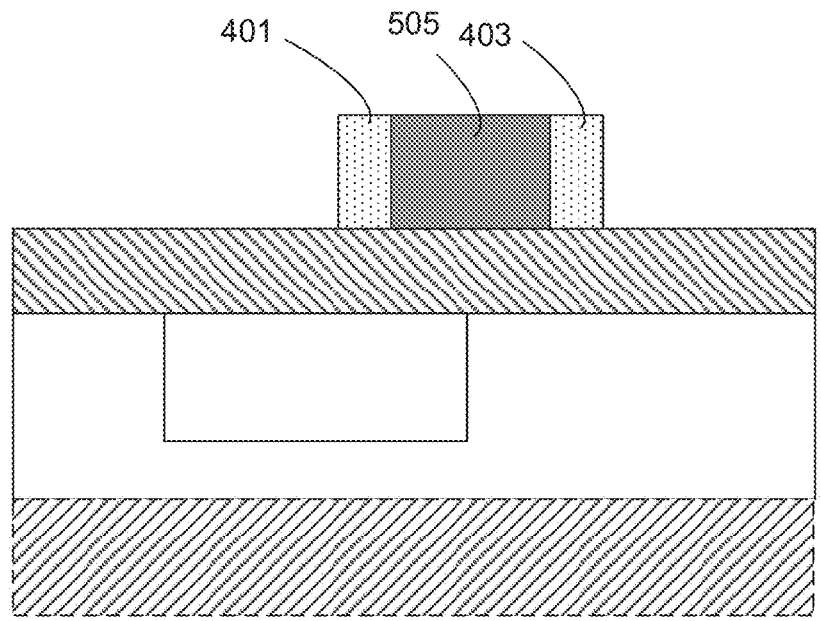
Figure 5C:
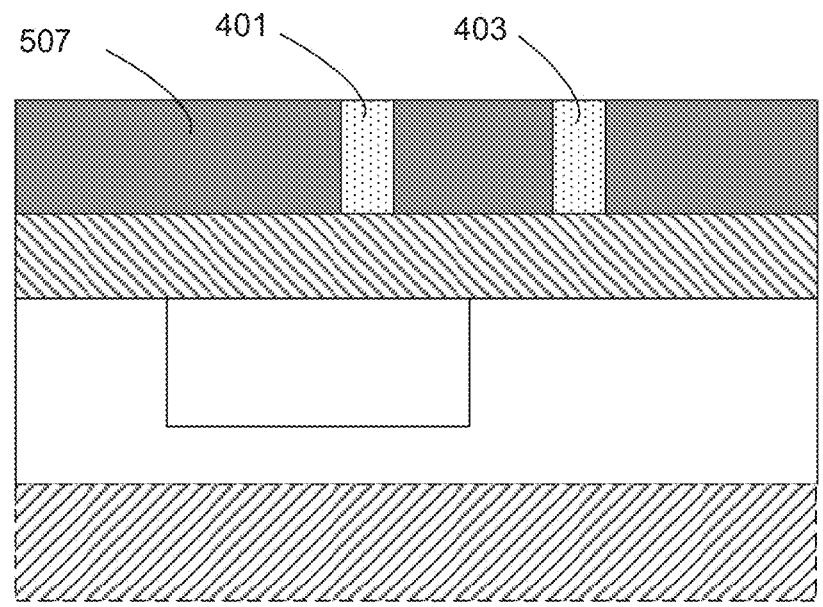

FIGS. 5A through 5C are schematic cross-sectional diagrams of forming a mask layer according to embodiments of the present disclosure.

FIG. 5A illustrates a situation in which a mask layer is formed through a mandrel-spacer method according to an embodiment of the present disclosure. As shown in FIG. 5A, a mandrel layer 501 can be formed on the hard mask 301. The mandrel layer 501 can be formed of silicon oxide, poly-Silicon, or the like. An opening can be formed at an expected position in the mandrel layer 501. In one embodiment, a first sidewall of the opening is located at the first region and a second sidewall is located at the second region, as shown in FIG. 5A. Then, a first spacer is formed on the first sidewall and a second spacer is formed on the second sidewall of the opening. The first and second spacers can act as the first and second patterns, respectively. Then, the mandrel layer 501 can be removed.

FIG. 5B illustrates another method of forming a mask layer. A sacrificial pattern 505 having sidewalls is formed on the hard mask 301. Then, spacers 403 and 401 (acting as the first and second patterns) are formed on the sidewalls of the sacrificial pattern 505. Then, the sacrificial pattern 505 is removed. In a sense, FIGS. 5B and 5A are similar, because the sacrificial pattern 505 can be regarded as a kind of mandrel.

FIG. 5C illustrates yet another method of forming a mask layer, in which a double patterning method is employed in which, for example, patterns 401 and 403 can be formed in a photo-resist 507 through photo-lithographing and exposing twice. Then, a portion of the photo-resist 507 that is not needed can be removed. In such a case, before etching with the mask layer, the patterns 401 and 403 can be baked to make the patterns 401 and 403 resistant to collapsing during the etching process.

Figure 6:
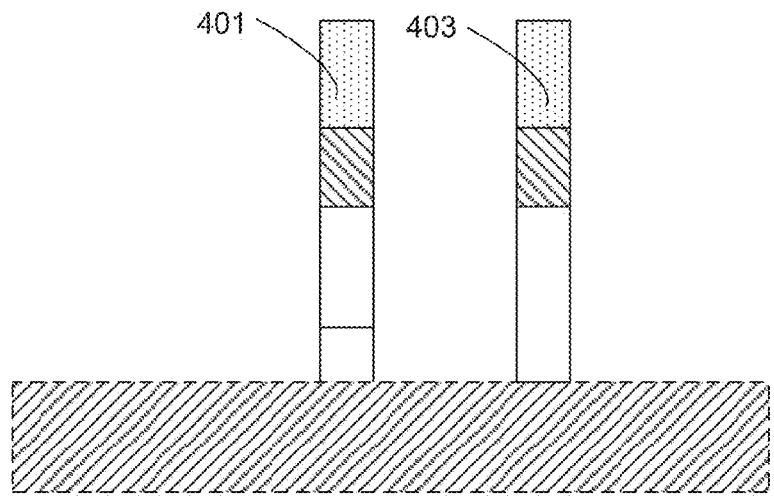
FIG. 6 is schematic cross-sectional diagram of forming fins through etching after forming of the mask layer of FIGS. 5A through 5C.

After forming the mask patterns 401 and 403, the hard mask and the first semiconductor layer are etched using the mask patterns, so that a first fin comprising a layer formed of the first semiconductor material is formed in the first region, as shown in FIG. 6. In one embodiment, a second fin comprising a layer formed of the second semiconductor material is also formed in the second region. As appreciated by those skilled in the art, the etching can be performed in multiple steps, for example, etching the hard mask 301 and the semiconductor layer (the first semiconductor layer), respectively. Alternatively, the etching can be performed in the same etching equipment in an all-in-one manner, without removing wafers out of the etching equipment.

In one embodiment, the first fin is adaptable for forming a P-channel semiconductor device, and the second fin is adaptable for forming an N-channel semiconductor device.

Figure 7A:
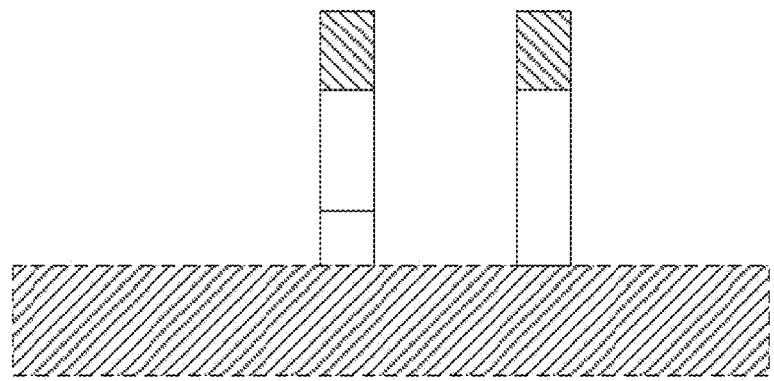
FIGS. 7A and 7B are schematic cross-sectional diagram of removing the mask and the hard mask after forming of the fins of FIG. 6.
Figure 7B:
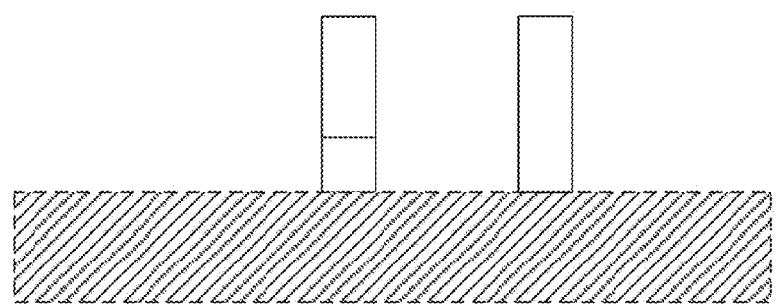

Then, the mask layer is removed. In some implementations, the hard mask can be remained to protect the fins. In other applications, the hard mask can be removed. FIG. 7A is a schematic cross-sectional diagram illustrating the situation in which the mask layer is removed while the hard mask is retained. FIG. 7B is a schematic cross-sectional diagram illustrating the situation in which both of the mask layer and hard mask are removed.

Figure 8A:
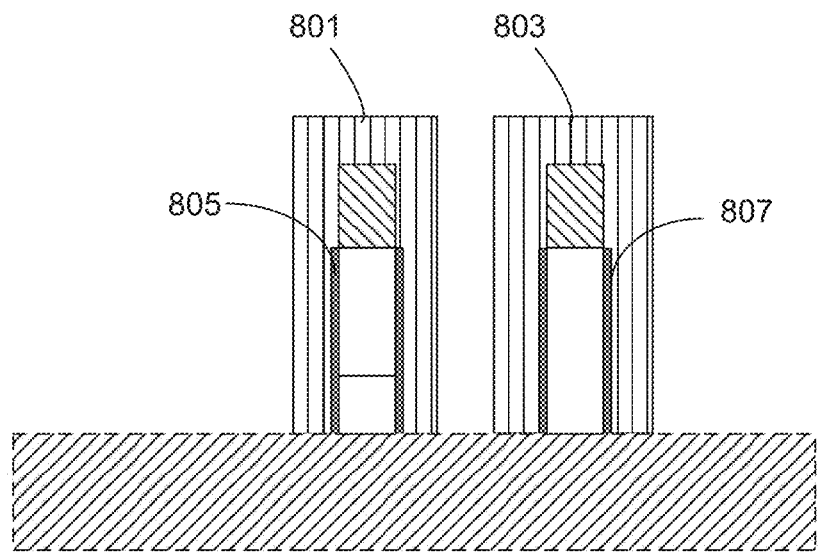
FIGS. 8A and 8B are schematic cross-sectional diagram of forming gate insulating layers and gates after the steps shown in FIGS. 7A and 7B according to embodiments of the present disclosure.
Figure 8B:
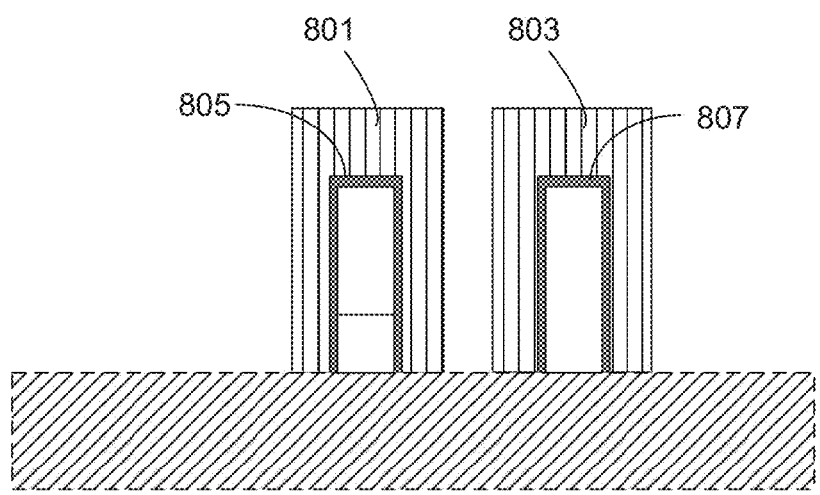

Then, source, drain, gate insulating layer(s) and gate can be formed according to traditional FinFET techniques. As shown in FIGS. 8A and 8B, the gate insulating layer 805 and gate 801 for the P-channel semiconductor device and the gate insulating layer 807 and gate 803 for the N-channel semiconductor device are formed. FIG. 8A illustrates a double-gate fin semiconductor device with the hard mask retained; and FIG. 8B illustrates a triple-gate fin semiconductor device with the hard mask removed. It should be appreciate that FIGS. 8A and 8B are merely illustrative, and the present disclosure is not limited thereto. Furthermore, it should be appreciated that the method according to the present disclosure may comprise a step of forming source and drain regions which are not shown in FIGS. 8A and 8B.

Further, in one embodiment, the gates can be formed of work function (WF) metals so as to benefit the adjustment of device thresholds. In other words, for the devices with different channel-types, gates formed of metals with different work functions can be provided. For example, work-function metals with appropriate work functions can be used for N-type (N-channel) and P-type (P-channel) devices, respectively. For example, as to P-type device, Os, Pt, Pd, Ir, Au, Pt, Cu and the like can be used; as to N-type device, W, Mo, Cu, Cr, Nb, Ta, Cd, Hf, La, Cs and the like can be used.

Although the steps of forming a semiconductor device according to some specific embodiments have been illustrated in the accompanying drawings, it should be understood that the present disclosure also provides a semiconductor device that may include a first fin formed of a first semiconductor material, and a second fin comprising a layer formed of a second semiconductor material, wherein the first semiconductor material is silicon, and the second semiconductor material is silicon-germanium (SiGe).

In one embodiment, the second fin further comprises, below the layer formed of the second semiconductor material, a layer formed of the first semiconductor material.

In one embodiment, the semiconductor device further comprises a hard mask layer located on the first and second fins, respectively.

In one embodiment, the semiconductor device further comprises an insulator layer that is disposed below the first and second fins.

In one embodiment, the first fin is used to form an N channel semiconductor device, and the second fin is used to form a P channel semiconductor device.

In one embodiment, the semiconductor device further comprises gate insulating layers and gates for the N channel semiconductor device and the P channel semiconductor device.

In one embodiment, the gate for the N channel semiconductor device and the gate for the P channel semiconductor device are formed of metals having respective appropriate work functions.

According to the present disclosure, the carrier mobility in P-channel FinFETs can be improved, and thus the requirement on fin dimensions can be relaxed with enhanced yield and lowered costs.

The embodiments of the present disclosure have been described as above with reference to the drawings. It should be appreciated that, however, these embodiments are merely illustrative in nature but not intended to limit the scopes of the disclosure. These embodiments can be arbitrarily combined without going beyond the scope of the present disclosure. In addition, the embodiments and details of the present disclosure can be modified by those skilled in the art in light of the teachings of the disclosure, without departing from the scope of the present disclosure. Therefore, all these modifications are embraced within the spirit and scope of the present teachings.

What is claimed is:

1. A method of manufacturing a semiconductor device comprising:
   (a) providing on a first substrate, a laterally extending first semiconductor layer and a laterally extending hard mask layer disposed on the first semiconductor layer, wherein the first semiconductor layer includes under the hard mask layer, a first region and a laterally adjacent but different second region, the first region being formed of a first semiconductor material, the second region being formed of a different second semiconductor material, wherein if the first and second semiconductor materials are both caused to be of a same conductivity type, then the second semiconductor material has a higher charge mobility than does the first semiconductor material of the same conductivity type;
   (b) forming a mask layer having a first pattern and a laterally spaced apart second pattern on the hard mask layer, the first pattern being located on a portion of the hard mask layer which is over the first region and the second pattern being located on a laterally spaced apart portion of the hard mask layer which is over the second region; and
   (c) etching the hard mask layer and the first semiconductor layer using the mask layer as an etch mask to form a first fin that includes material of the first region and a second fin that includes material of the second region such that the first fin is formed of the first semiconductor material but not the second semiconductor material, and such that the second fin comprises the second semiconductor material.

2. The method according to claim 1, wherein the step (b) of forming the mask layer having the laterally spaced apart first and second patterns comprises:
   (b1) forming a mandrel layer on the first hard mask layer, the mandrel layer having an opening formed therein, a first sidewall of the opening being located at the first region and a second sidewall of the opening being located at the second region;
   (b2) converting the mandrel sidewalls to thereby form a first spacer on the first sidewall which formed first spacer will become the first pattern, and to thereby form a second spacer on the second sidewall which formed second spacer will become the second pattern; and
   (b3) removing unconverted portions of the mandrel layer to thereby leave behind the first and second patterns.

3. The method according to claim 1 further comprising:
   (d) removing the mask layer.

4. The method according to claim 3 further comprising:
   (e) removing the hard mask layer.

5. The method according to claim 1 and further comprising a providing of the first substrate by means of:
   (a1) providing a bulk substrate substantially comprised of silicon (Si); and
   (a2) selectively forming a SiGe region in the bulk substrate.

6. The method according to claim 5 wherein the provided bulk substrate is an SOI substrate that comprises an insulator layer buried below a top semiconductor layer, the top semiconductor layer defining said first semiconductor layer.

7. The method according to claim 5 wherein:
   said same conductivity type is the P conductivity type and in that case the first semiconductor material is Silicon (Si) and the second semiconductor material is Silicon-Germanium (SiGe); and
   the selectively forming of the SiGe material in the Si material comprises:
   (a21) forming a sacrificial blocking layer on the Si layer;
   (a22) forming an opening through the sacrificial blocking layer extending into the Si layer;
   (a23) selectively growing silicon-germanium (SiGe) in the opening; and
   (a24) removing the sacrificial blocking layer.

8. The method according to claim 7, further comprising:
   performing annealing or oxidation after forming the SiGe layer.

9. The method of claim 1 wherein:
   said same conductivity type is the P conductivity type and in that case the first semiconductor material is Silicon (Si) and the second semiconductor material is Silicon-Germanium (SiGe).

10. The method according to claim 9 wherein the first fin is adaptable for forming an N-channel semiconductor device and the second fin is adaptable for forming a P-channel semiconductor device.

11. The method according to claim 10 further comprising:
(f) forming gate insulating layers and gates for the N channel semiconductor device and the P channel semiconductor device.

12. The method according to claim 11 wherein the gate for the N channel semiconductor device and the gate for the P channel semiconductor device are formed of metals having respective appropriate work functions.

* * * * *